(12) United States Patent
Lopatin et al.

(10) Patent No.: US 6,489,683 B1
(45) Date of Patent: Dec. 3, 2002

(54) VARIABLE GRAIN SIZE IN CONDUCTORS FOR SEMICONDUCTOR VIAS AND TRENCHES

(75) Inventors: Sergey D. Lopatin, Santa Clara, CA (US); John A. Iacoponi, Austin, TX (US)

(73) Assignee: Advanced Micro Devices, Inc., Sunnyvale, CA (US)

(\*) Notice: Subject to any disclaimer, the term of this patent is extended or adjusted under 35 U.S.C. 154(b) by 0 days.

(21) Appl. No.: 09/975,032

(22) Filed: Oct. 10, 2001

Related U.S. Application Data

(62) Division of application No. 09/276,839, filed on Mar. 26, 1999, now Pat. No. 6,340,633.

(51) Int. Cl.$^7$ ............................................. H01L 23/48
(52) U.S. Cl. ...................... 257/750; 257/753; 257/762; 257/765
(58) Field of Search ................................ 257/750, 753, 257/762, 765; 438/678

(56) References Cited

U.S. PATENT DOCUMENTS

| | | | | |
|---|---|---|---|---|
| 3,876,389 A | * | 4/1975 | Chaudhari et al. | 428/608 |
| 5,906,725 A | * | 5/1999 | Lin et al. | 205/250 |
| 5,972,192 A | * | 10/1999 | Dubin et al. | 205/101.6 |
| 6,024,857 A | * | 2/2000 | Reid | 205/123 |
| 6,074,544 A | * | 6/2000 | Reid et al. | 205/157 |
| 6,242,349 B1 | * | 6/2001 | Nogami et al. | 438/687 |
| 6,297,157 B1 | * | 10/2001 | Lopatin et al. | 438/687 |

\* cited by examiner

*Primary Examiner*—T. N. Quach
(74) *Attorney, Agent, or Firm*—Mikio Ishimaru

(57) ABSTRACT

A method is provided for forming conductive layers in semiconductor channels and vias by using ramped current densities for the electroplating process. The lower density currents are used initially to deposit a fine grain conductive layer in the vias and then higher densities are used to deposit a large grain conductive layer in the channel.

5 Claims, 3 Drawing Sheets

VARIABLE GRAIN SIZE IN CONDUCTORS FOR SEMICONDUCTOR VIAS AND TRENCHES

CROSS-REFERENCE TO RELATED APPLICATION

This is a divisional of application Ser. No. 09/276,839 filed on Mar. 26, 1999, U.S. Pat. No. 6,340,633 which is incorporated by reference herein.

The present application contains subject matter related to a concurrently filed U.S. patent application by Sergey D. Lopatin entitled "METHOD FOR LOW STRESS PLATING OF SEMICONDUCTOR VIAS AND TRENCHES". This and the related application, identified by Ser. No. 09/276,840, abandoned, are commonly assigned to Advanced Micro Devices, Inc.

TECHNICAL FIELD

The present invention relates generally to semiconductors and more specifically to electroplating of conductors used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by an electroplating of the conductive material on the seed layer in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper electroplating is a slow process, which means that manufacturing throughput is relatively low.

Another drawback of using copper is that copper is subject to electromigration, which means that copper migrates under the influence of current flow. This means that areas where the current density is relatively high, such as in vias, there is a tendency to form voids. This tends to increase current density further which increases the size of the voids until open circuits occur.

Separate solutions for both problems have been long sought but have eluded those skilled in the art. As the semiconductor industry is moving from aluminum to copper and other type of materials with greater electrical conductivity and thinner channels and vias, it is becoming more pressing that solutions be found.

DISCLOSURE OF THE INVENTION

The present invention provides a method for forming conductive layers in semiconductor channels and vias by using ramped current densities for the electroplating process. The lower density currents are used initially to deposit a fine grain conductive layer in the vias and then higher densities are used to deposit a large grain conductive layer in the channel. This speeds up the overall manufacturing process while the fine grain structure increases electromigration resistance.

The present invention provides a method for forming conductive layers in semiconductor channels and vias by using ramped direct current for the electroplating process. This speeds up the overall manufacturing process and deposits a fine grain structure conductive layer which increases electromigration resistance.

The present invention provides a method for forming conductive layers in semiconductor channels and vias by using ramped forward pulse current for the electroplating process. This speeds up the overall manufacturing process and deposits a fine grain structure conductive layer which increases electromigration resistance.

The present invention provides a method for forming conductive layers in semiconductor channels and vias by using ramped reverse pulse current for the electroplating process. This speeds up the overall manufacturing process and deposits a fine grain structure conductive layer which increases electromigration resistance.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
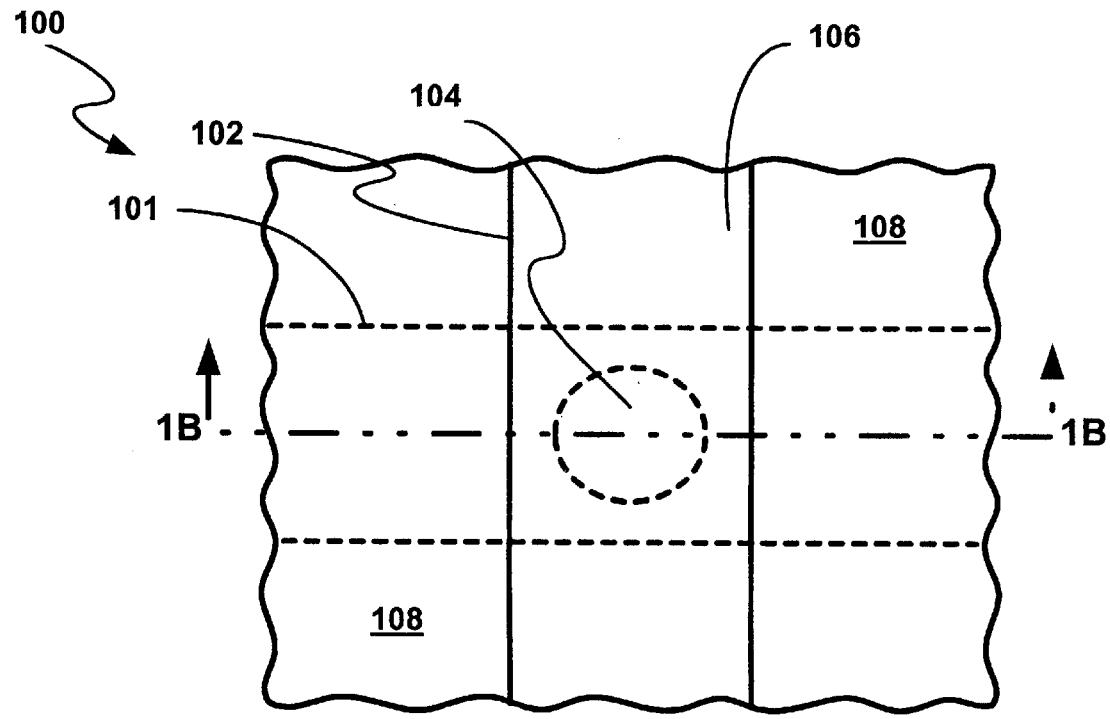
FIG. 1A (PRIOR ART) is a plan view of aligned channels with a prior art via.

Referring now to FIG. 1A (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
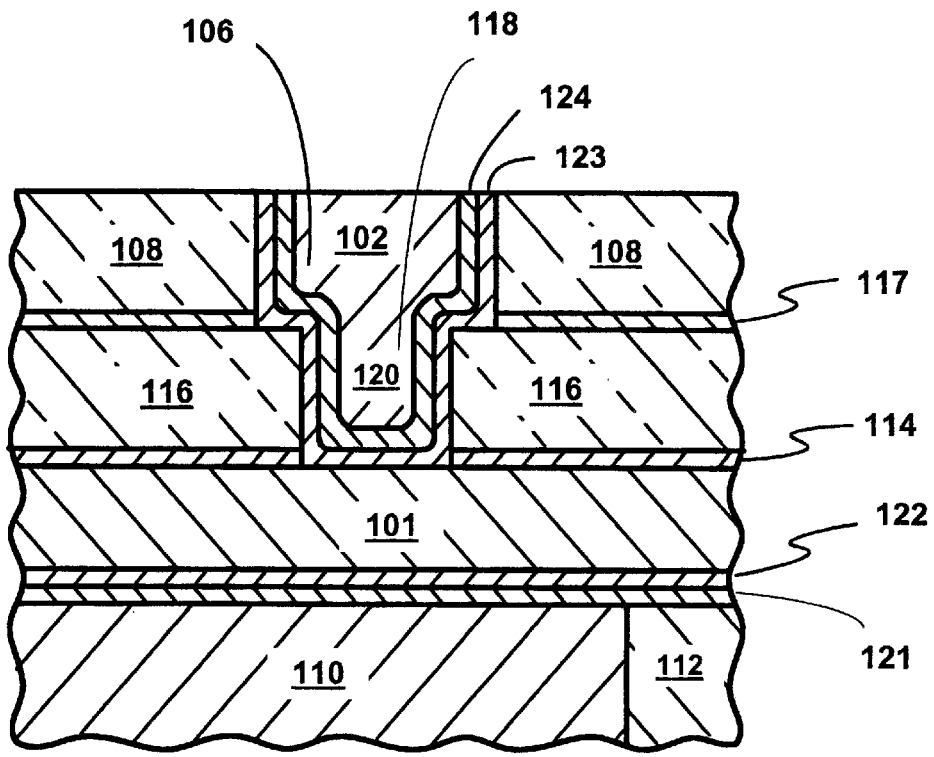
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are an adhesion/barrier layer 121 and seed layer 122, and around the second channel 102 and the cylindrical via 120 is an adhesion/barrier layer 123 and seed layer 124. The adhesion/barrier layers include adhesion/barrier material combinations such as titanium/titanium nitride, tantalum/tantalum nitride, and tungsten nitride for copper seed layers and copper or copper alloy conductive materials.

In electroplating semiconductors, the semiconductor wafer 100 would be placed in an electroplating bath having a solution of the conductive material ions, and the seed layer 124 would be used as an electrode for the conductive material to be deposited upon. In the past, a number of different ways of applying the plating current were used. Three approaches were direct current, forward pulse current, and reverse pulse current. The power levels of these approaches were generally constant with the compromise being made between trying to obtain a fine grain size of the deposited material versus the time the process took. Therefore, the usual procedure was to seek the fastest electroplating time which would still permit fine enough grain size to meet certain electro-migration life expectancies.

Figure 2:
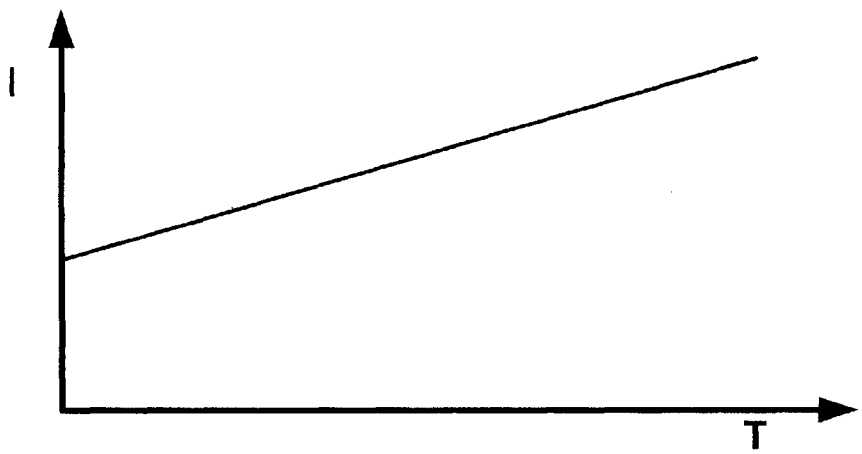
FIG. 2 is a chart of a direct current ramp for electroplating used in the present invention.

Referring now to FIG. 2, therein is shown a chart of the direct current ramp for electroplating. Initially, the direct current is started at a low flow rate to cause the conductive material to be deposited with a very fine grain size. This maximizes resistance to electro-migration. Since these fine grain sizes are achieved near the surface of the seed layer 124, excellent adhesion is achieved which also promotes good electro-migration resistance. Further, since the vias are smaller than the channels, the vias tend to fill first with fine grain size conductive material.

Subsequently, the current level is increased to as to cause the formation of larger grain sizes which more quickly fill up the channels.

Figure 3:
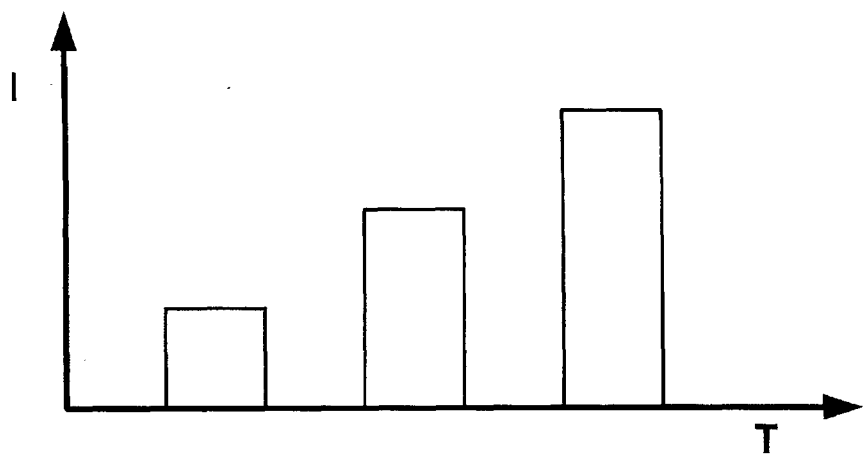
FIG. 3 is a chart of a forward pulse current ramp for electroplating used in the present invention.

Referring now to FIG. 3, therein is shown a chart of a forward pulse current ramp. While it is understood that forward pulse current applies a large number of pulses, three pulses are shown to demonstrate the increasing amount of forward pulse current being applied. The forward pulse current approach allows for better circulation of conductive material ions to the seed layer during electro-deposition.

Figure 4:
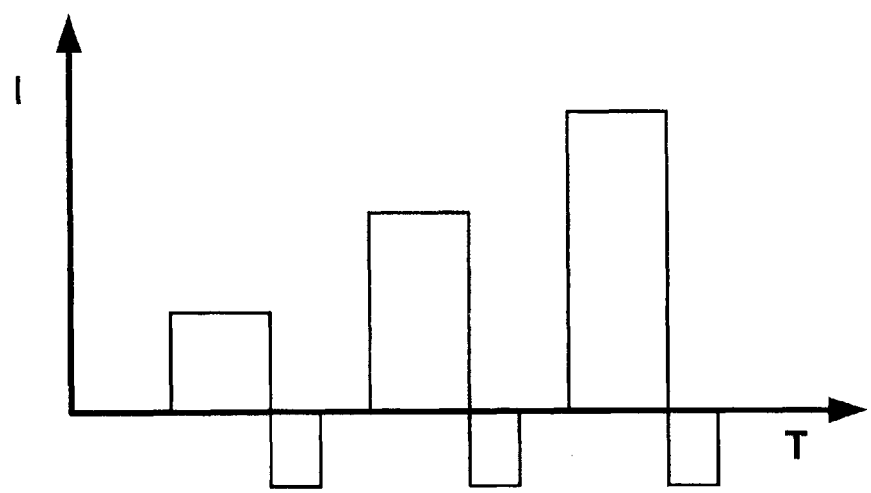
FIG. 4 is a chart of a reverse pulse current ramp for electroplating used in the present invention.

Referring now to FIG. 4, therein is shown a chart of a reverse pulse current ramp. As would be understood in the process there are many forward and reverse pulses, but three are shown for convenience. Again, the gradually increasing current impulses are shown with the reverse pulses in-between. This process circulates the material ions even better than just a strict forward pulse process and thus allows even faster plating.

Figure 5:
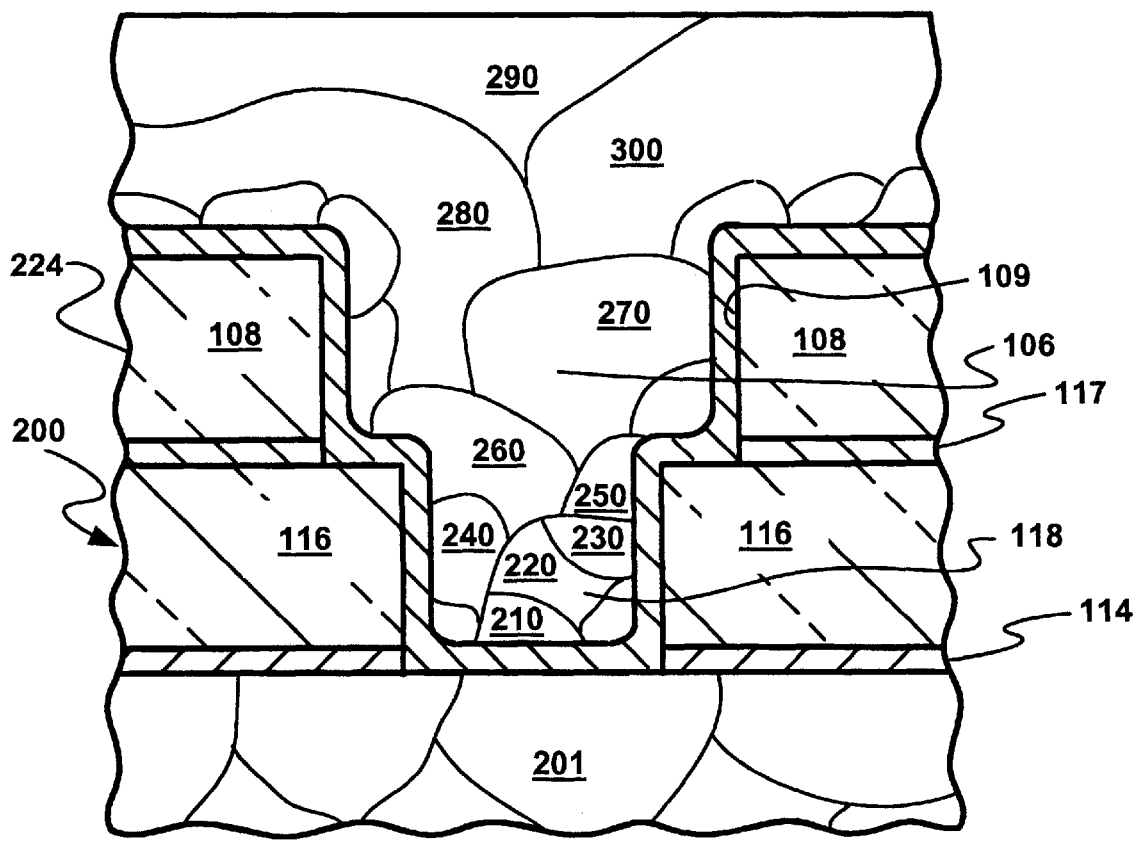
FIG. 5 is a simplified cross-section of a semiconductor wafer formed in accordance with the present invention.

Referring now to FIG. 5, therein is shown the cross-section of a semiconductor wafer 200 with a pair of perpendicularly aligned semiconductor channels, disposed over a silicon substrate 110 formed in accordance with the present invention. For convenience of illustration, like reference numerals are used in FIG. 5 to denote like elements already described in FIG. 1A (PRIOR ART) through FIG. 1C (PRIOR ART). Similarly, for purposes of clarity, the adhesion/barrier layer 123, seed layer 122, adhesion/barrier layer 121, polysilicon gate 110 and dielectric 112 are not shown.

At this stage, the seed layer 124 is shown formed in the second channel opening 106 and the via 118. In the via 118 are shown fine grain size 210, 220, 230, 240, and 250. The grain boundaries, such as between conductive materials 210 and 220, help prevent the electro-migration of the conductive material from the conductive channel 201 through to the conductive channel 106. These fine grain sizes are deposited at the lower current densities which are applied for longer periods of time.

As the plating process is speeded up using higher current densities, the grain sizes start to increase in size as shown by the larger grain conductive material 260, 270, 280, 290, and 300.

As would be evident to those skilled in the art, any time lost by the deposition of the fine grain size conductive material would be more than compensated for by the speed at which the large grain size conductive material could be deposited. Thus, there would be a significant increase in the throughput of the ramped current density approach of the current invention.

In production, a conventional first damascene process was used to dispose a first channel 201 in a first channel oxide layer (not shown) above portions of a semiconductor device (not shown) on a production semiconductor wafer 200. The damascene process is a photolithographic process which uses a mask to define a first channel opening (not shown) in the first channel oxide layer. The first channel opening is then filled with a adhesion/barrier layer, a seed layer, and a first conductive material, such as copper, to form the first channel 201 using the ramped current density electroplating technique of the present invention. The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via 104 in the via nitride layer 117, the basis for the cylindrical via 118 was formed. The subsequent deposition of the second channel oxide layer 108 prepares the way for the second channel 106 to be perpendicular to the first channel 201.

The second damascene process uses a further mask to define the second channel opening 106 in the second channel oxide layer 108. Since the second damascene process uses an anisotropic oxide etch, the etch also forms the cylindrical via 118 down to the stop nitride layer 114. The anisotropic oxide etch etches faster in the vertical direction of FIG. 5 than in the horizontal direction. The nitride etch of the stop nitride layer 114 exposes a portion of the first channel 201 and completes the etching steps.

Next, a thin adhesion/barrier layer (not shown) is deposited in the second channel opening 106 and the cylindrical via 118, including along the walls of the second channel opening 106 and the cylindrical via 118. The thickness of the adhesion/barrier material is insufficient to fill the second channel opening 106 and the cylindrical via 118. Examples of suitable adhesion/barrier materials include refractory combinations as titanium/titanium nitride, tantalum/tantalum nitride, and tungsten nitride. The adhesion/barrier layer is deposited using conventional deposition techniques, such as physical vapor deposition, chemical vapor deposition, or a combination thereof.

Thereafter, the thin seed layer 124 is deposited on the adhesion/barrier layer in the second channel opening 106 and the cylindrical via 118. Again, the thickness of the seed layer 124 is insufficient to fill the second channel opening 106 and the cylindrical via 118. Examples of suitable seed materials include copper and copper alloys. The seed layer 224 is deposited using a conventional metal deposition technique such as ion metal plasma (IMP), hollow cathode metalization (HCM), combinations of them with electroplating, or electroless deposition. In these processes, the metal ions are charged and directed toward the silicon wafer 200 to be deposited.

Next, the second conductive material is deposited into second channel opening 106 and via 118 on top of the seed layer 224 using the ramped current density electroplating technique. Thereafter, a chemical mechanical polishing process is used to complete the conventional connection process similar to what were shown and described in FIGS. 1A and 1B.

While the best mode utilizes copper as the conductive material, it should be understood that the present invention is applicable to other conductive and electroplating materials such as aluminum, copper, gold, silver, an alloy thereof, and a combination thereof.

Further, although the embodiments of the present invention are directed to using the dual damascene technique, it also will be recognized by those skilled in the art that other techniques of forming interconnects or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel, it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device comprising:

a silicon substrate;

a dielectric disposed on said silicon substrate, said dielectric having an opening provided therein;

a seed layer disposed in and lining said opening in said dielectric; and a conductive layer disposed in said seed layer, said conductive material having fine grain size conductive material proximate said seed layer and large grain size conductive material distal therefrom, and said conductive material is deposited by a ramped pulsed current density plating process.

2. The semiconductor device as claimed in claim 1 including;

a further dielectric layer disposed thereon, said further dielectric layer having channels and vias provided therein, said vias in contact with said conductive material in said dielectric;

a further seed layer disposed in said channels and vias provided in said further dielectric layer; and further conductive material disposed in said further seed layer, said further conductive material having smaller grain size conductive material inside said via than in said channel.

3. The semiconductor device as claimed in claim 1 wherein said conductive material is selected from a group comprising aluminum, copper, gold, silver, an alloy thereof, and a combination thereof.

4. The semiconductor device as claimed in claim 1 wherein said conductive material is copper.

5. The semiconductor device as claimed in claim 1 wherein said conductive material is deposited by a ramped current density electroplating process.

* * * * *